US010845706B2

(12) United States Patent
Steeghs et al.

(10) Patent No.: US 10,845,706 B2
(45) Date of Patent: Nov. 24, 2020

(54) MIRROR ARRAY

(71) Applicant: ASML Netherlands B.V., Veldhoven (NL)

(72) Inventors: Marco Matheus Louis Steeghs, Sevenum (NL); Tian Gang, Best (NL); Mehdi Yousefi Moghaddam, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/500,460

(22) PCT Filed: Mar. 8, 2018

(86) PCT No.: PCT/EP2018/055699
§ 371 (c)(1),
(2) Date: Oct. 3, 2019

(87) PCT Pub. No.: WO2018/188859
PCT Pub. Date: Oct. 18, 2018

(65) Prior Publication Data
US 2020/0033734 A1   Jan. 30, 2020

(30) Foreign Application Priority Data

Apr. 12, 2017  (EP) ..................... 17166181

(51) Int. Cl.
*G03F 7/20*   (2006.01)
*G01J 1/42*   (2006.01)
*G02B 26/08*  (2006.01)

(52) U.S. Cl.
CPC .......... *G03F 7/70133* (2013.01); *G01J 1/429* (2013.01); *G01J 1/4257* (2013.01);
(Continued)

(58) Field of Classification Search
CPC .... G01J 1/4257; G01J 1/429; G02B 26/0833; G03F 7/70133; G03F 7/702; G03F 7/70291; G03F 7/70891
(Continued)

(56) References Cited

U.S. PATENT DOCUMENTS 5,739,541 A   4/1998  Kahilainen
6,081,581 A   6/2000  Hasegawa
(Continued)

FOREIGN PATENT DOCUMENTS

CN   2703328 Y    6/2005
CN   203298763 U  11/2013
(Continued)

OTHER PUBLICATIONS

Florentina Calafus, European International Searching Authority, International Search Report and Written Opinion, counterpart PCT Application No. PCT/EP2018/055699, dated Jun. 8, 2018, 26 pages total.

(Continued)

*Primary Examiner* — Colin W Kreutzer
(74) *Attorney, Agent, or Firm* — DiBerardino McGovern IP Group LLC

(57) ABSTRACT

A mirror array, at least some of the mirrors of the array comprising a reflective surface and an arm which extends from a surface opposite to the reflective surface, wherein the mirror array further comprises a support structure provided with a plurality of sensing apparatuses, the sensing apparatuses being configured to measure gaps between the sensing apparatuses and the arms which extend from the mirrors.

21 Claims, 5 Drawing Sheets

(52) U.S. Cl.
CPC ......... *G02B 26/0833* (2013.01); *G03F 7/702* (2013.01); *G03F 7/70108* (2013.01); *G03F 7/70116* (2013.01); *G03F 7/70291* (2013.01); *G03F 7/70891* (2013.01)

(58) Field of Classification Search
USPC .............................................. 355/30, 67, 77
See application file for complete search history.

(56) References Cited

U.S. PATENT DOCUMENTS

| | | | |
|---|---|---|---|
| 6,416,913 | B1 | 7/2002 | Suzuki |
| 7,705,307 | B1 | 4/2010 | Zhao et al. |
| 8,357,901 | B2 | 1/2013 | Shen |
| 9,651,423 | B1 | 5/2017 | Zhang |
| 2005/0140950 | A1 | 6/2005 | Franken et al. |
| 2008/0151221 | A1 | 6/2008 | Sogard |
| 2008/0179523 | A1 | 7/2008 | Barker et al. |
| 2010/0141917 | A1 | 6/2010 | Meltzer et al. |
| 2014/0211187 | A1 | 7/2014 | Hauf et al. |
| 2014/0218703 | A1 | 8/2014 | Mizuno |
| 2014/0327895 | A1 | 11/2014 | Waldis et al. |
| 2015/0185469 | A1 | 7/2015 | Horn et al. |
| 2016/0258810 | A1 | 9/2016 | Van Der Post |

FOREIGN PATENT DOCUMENTS

| | | |
|---|---|---|
| CN | 104649213 A | 5/2015 |
| CN | 105606640 A | 5/2016 |
| CN | 106814100 A | 6/2017 |
| JP | H07147224 A | 6/1995 |
| JP | H08193881 A | 7/1996 |
| JP | H09162106 A | 6/1997 |
| JP | H1058177 A | 3/1998 |
| JP | 2004095361 A | 3/2004 |
| JP | 2013178445 A | 9/2013 |

OTHER PUBLICATIONS

David Attwood, Plasma Sources for EUV Lithography, Lecture 18, Spring 2009, 41 pages total.

Björn A.M. Hansson, Laser-Plasma Sources for Extreme-Ultraviolet Lithography, Doctoral Thesis, KTH Royal Institute of Technology, Nov. 2003.

Lan Hui et al., Spectral and ion emission features of laser-produced Sn and SnO2 plasmas, Chinese Physics B, 2016, 25(3): 035202.

Andrei Nemilentsau et al., Broadband achromatic anomalous mirror in near-IR and visible frequency range, arXiv:1610.05236v1 [cond-mat.mes-hall], Oct. 17, 2016.

MIRROR ARRAY

CROSS-REFERENCE TO RELATED APPLICATIONS

This application claims priority of EP application 17166181.2 which was filed on Apr. 12, 2017, and which is incorporated herein in its entirety by reference.

FIELD

The present invention relates to a mirror array and to a method of measuring radiation power. The mirror array may form part of a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

EUV radiation for use by a lithographic apparatus is generated by a source which may for example be a laser produced plasma (LPP) source. The amount of power output from the EUV radiation source will vary over time. If the power of EUV radiation output from the EUV radiation source is too high then this may cause damage to components of the lithographic apparatus. If the power of EUV radiation is too small then this will reduce the speed at which the lithographic apparatus can operate, and thereby reduce the number of substrates exposed by the lithographic apparatus per hour (which may be referred to as throughput). It is therefore desirable to be able to measure the power of EUV radiation, since this measurement allows the EUV radiation source to be adjusted accordingly.

SUMMARY

It may be desirable to provide a method of measuring radiation power which is not taught by the prior art, and to provide a mirror array configured to provide a radiation power measurement.

According to a first aspect of the invention there is provided a mirror array, at least some of the mirrors of the array comprising a reflective surface and an arm which extends from a surface opposite to the reflective surface, wherein the mirror array further comprises a support structure provided with a plurality of sensing apparatuses, the sensing apparatuses being configured to measure gaps between the sensing apparatuses and the arms which extend from the mirrors.

The gaps between the sensing apparatuses and the arms which extend from the mirrors are determined by the temperatures of the mirrors and the arms. The temperatures of the mirrors and the arms is in turn determined by the power of radiation which is absorbed by the mirrors. Thus, measuring the gaps allows the power of radiation incident on the mirrors to be measured.

The sensing apparatuses may be configured to measure gaps between the sensing apparatuses and ends of the mirror arms.

A magnet and inductive material may be provided at the end of at least some of the mirror arms.

The magnet and the inductive material may be formed from different materials. Alternatively, the magnet and the inductive material may comprise the same material.

At least some of the sensing apparatuses may comprise a plurality of eddy current sensors.

The mirror array may further comprise actuators configured to move the mirrors to desired orientations.

The actuators may be electromagnets.

According to a second aspect of the invention there is provide a system comprising the mirror array of the first aspect, and further comprising a processor configured to receive the measured gaps between the sensor apparatuses and the associated mirror arms when EUV radiation is incident upon the mirror array, the processor further being configured to compare the measured gaps with gaps previously measured when EUV radiation is not incident upon the mirror array to provide gap change measurements.

The gap change measurements may advantageously indicate the power of radiation incident upon mirrors of the mirror array.

The processor may be configured to compare gap change measurements with previously obtained gap change measurements.

Advantageously, this allows changes of the power of radiation incident upon the mirrors of the mirror array to be measured. Power change measurements may be measured in relative terms, without determining absolute power values.

The processor may be configured to determine a power of radiation incident upon the mirrors using a known relationship between the power of incident radiation and the gap changes.

The known relationship may be expressed as a model which takes into account the absorption of radiation by mirrors of the mirror array, a thermal expansion coefficient of the arm, and the length of the arm.

The known relationship may comprise stored data indicating gap changes for a plurality of different incident radiation intensities.

Optional features of the second aspect of the invention may be combined with optional features of the first aspect of the invention.

According to a third aspect of the invention there is provided a lithographic apparatus comprising an illumination system configured to condition a radiation beam, a support structure constructed to support a patterning device, the patterning device being capable of imparting the radiation beam with a pattern in its cross-section to form a patterned radiation beam, a substrate table constructed to hold a substrate, and a projection system configured to project the patterned radiation beam onto the substrate, wherein the illumination system comprises a mirror array according to the first aspect of the invention.

The third aspect of the invention may be combined with optional features of the first aspect of the invention.

According to a fourth aspect of the invention there is provided a lithographic apparatus comprising an illumination system configured to condition a radiation beam, a support structure constructed to support a patterning device, the patterning device being capable of imparting the radiation beam with a pattern in its cross-section to form a patterned radiation beam, a substrate table constructed to hold a substrate, and a projection system configured to project the patterned radiation beam onto the substrate, wherein the illumination system comprises a system according to the second aspect of the invention, wherein the lithographic apparatus further comprises a sensor provided on the substrate table, and wherein the processor is configured to compare measurements obtained using the sensor apparatuses of the mirror array with measurements obtained using the sensor on the substrate table.

The fourth aspect of the invention may be combined with optional features of the second aspect of the invention.

The system may further comprise a sensor provided on the patterning device support structure. The processor may be configured to compare measurements obtained using the sensor apparatuses of the mirror array with measurements obtained using the sensor on the patterning device support structure.

According to a fifth aspect of the invention there is provided a method of measuring radiation power at a mirror array, the mirror array comprising at least some mirrors which comprise a reflective surface and an arm which extends from a surface opposite to the reflective surface, the mirror array further comprising a support structure provided with a plurality of sensing apparatuses, wherein the method comprises using the sensing apparatuses to measure gaps between the sensing apparatuses and the arms which extend from the mirrors.

The gaps between the sensing apparatuses and the arms which extend from the mirrors are determined by the temperatures of the mirrors and the arms. The temperatures of the mirrors and the arms is in turn determined by the power of radiation which is absorbed by the mirrors. Thus, measuring the gaps allows the power of radiation incident on the mirrors to be measured.

The gaps may be measured when EUV radiation is not incident upon the mirror array. The gaps may be measured when EUV radiation is incident upon the mirror array. The measured gaps may be compared to provide gap change measurements.

The method may further comprise comparing gap change measurements with previously obtained gap change measurements.

The method may further comprise determining a power of radiation incident upon the mirrors using a known relationship between the power of incident radiation and the gap changes.

The known relationship may be expressed as a model which takes into account the absorption of radiation by the mirrors, a thermal expansion coefficient of the arms, and the length of the arms.

The known relationship may comprise stored data indicating gap changes for a plurality of different incident radiation intensities.

The method may further comprise using the gap change measurements to identify damage to a mirror of the mirror array.

The mirror array may form part of a lithographic system. The method may further comprise using the gap change measurements to identify localized contamination on a radiation collector of the lithographic system.

Features of the fifth aspect of the invention may be combined with features of other aspects of the invention.

BRIEF DESCRIPTION OF THE DRAWINGS

Embodiments of the invention will now be described, by way of example only, with reference to the accompanying schematic drawings, in which.

DETAILED DESCRIPTION

Figure 1:
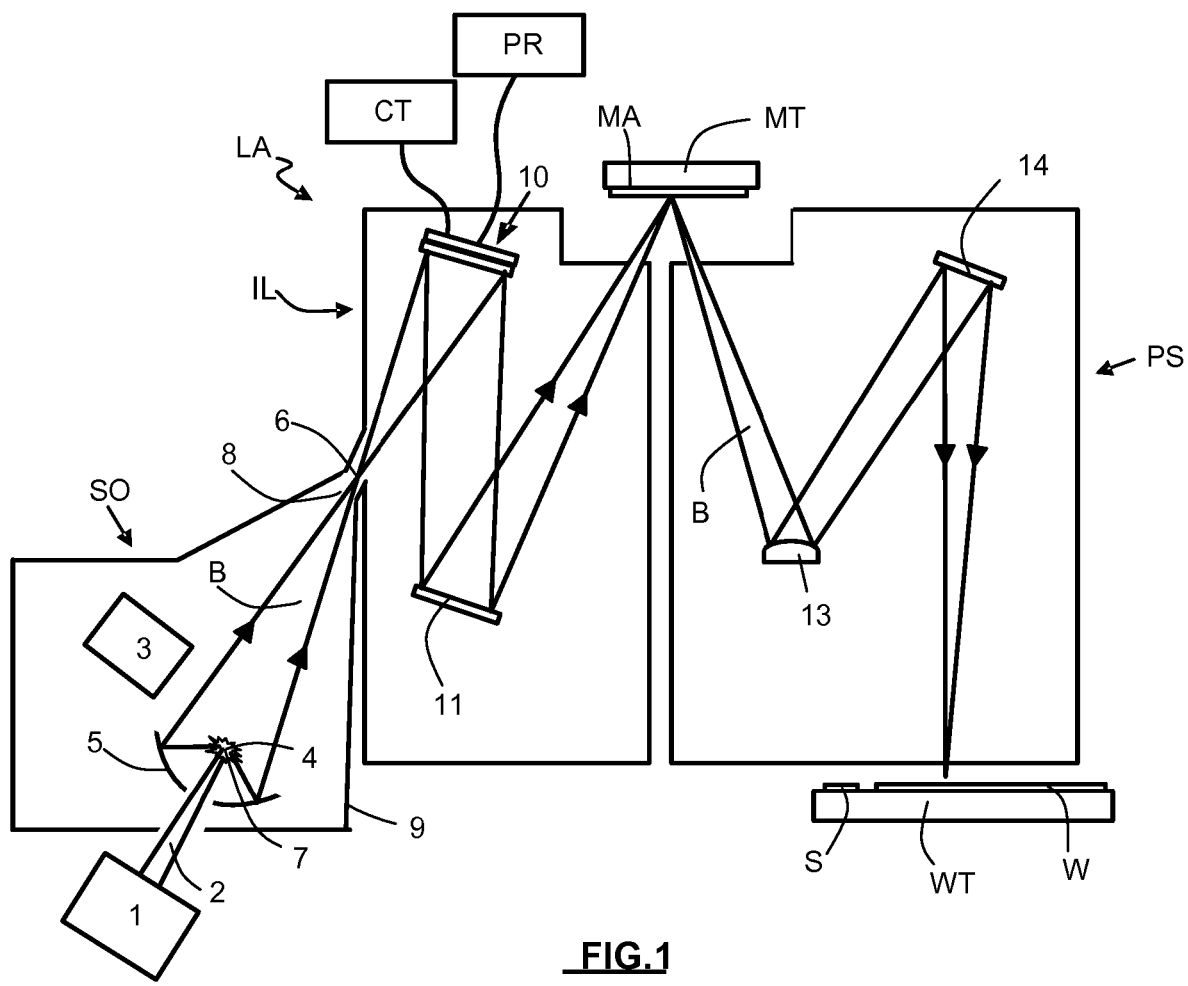
FIG. 1 depicts a lithographic system comprising a radiation source and a lithographic apparatus according to an embodiment of the invention.

FIG. 1 shows a lithographic system including a mirror array according to one embodiment of the invention. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source). A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure which is arranged to reflect EUV radiation (e.g. EUV radiation having a desired wavelength such as 13.5 nm). The collector 5 may have an ellipsoidal configuration, having two ellipse focal points. A first focal point may be at the plasma formation region 4, and a second focal point may be at an intermediate focus 6, as discussed below.

The laser 1 may be remote from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL includes a facetted field mirror device 10 and may include a facetted pupil mirror device 11. The faceted field mirror device 10 is a mirror array made up of individually controllable mirrors. A mirror of the array together with an associated actuator and sensing apparatus may be referred to as a mirror assembly. A controller CT controls the orientations of the mirrors (as is described further below). The faceted field mirror device 10 and faceted pupil mirror device 11 together provide the radiation beam B with a desired cross-sectional shape and a desired angular intensity distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors 13, 14 which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors 13, 14 in FIG. 1, the projection system may include any number of mirrors (e.g. six mirrors).

The radiation source SO shown in FIG. 1 may include components which are not illustrated. For example, a spectral filter may be provided in the radiation source. The spectral filter may be substantially transmissive for EUV radiation but substantially blocking for other wavelengths of radiation such as infrared radiation.

Figure 2B:
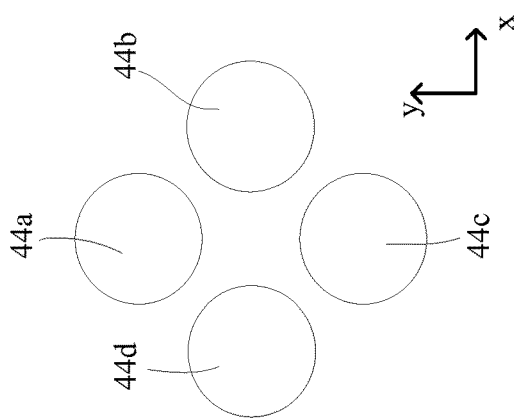
FIG. 2 depicts a mirror assembly which forms part of an embodiment of the invention.

FIG. 2 schematically depicts a mirror assembly 19 of the faceted field device 10 (which is an example of a mirror array). An outer surface 22 of the mirror 20 is reflective to EUV radiation, for example having a multi-layer structure formed from layers of alternating reflective indices. The thickness of the layers is selected such that constructive interference of EUV radiation reflected from layer boundaries is provided.

An arm 24 extends from a surface 26 of the mirror which is opposite to the reflective face 22. The surface 26 may be referred to as a rear surface of the mirror. The arm 24 is connected to the centre of the rear surface 26 of the mirror (although it may be connected at some other point on the rear surface of the mirror). The connection between the arm 24 and the mirror 20 is rigid such that movement of the arm will cause movement of the mirror. Leaf springs 28 also extend from the rear surface of the mirror 20. A connector 34 receives the leaf springs 28 and is in turn connected to a support structure 30. The connector 34 may for example be a ring that is welded onto the support structure 30. The connector 34 may be metal. The leaf springs 28 may for example be welded or bolted to the connector 34. The connector 34 may have a known thermal resistance.

Figure 2C:
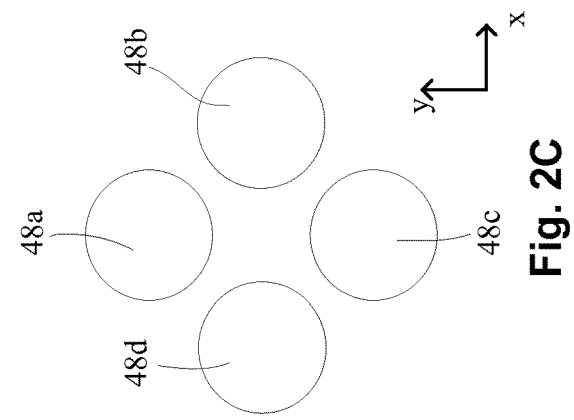
Figure 2A:
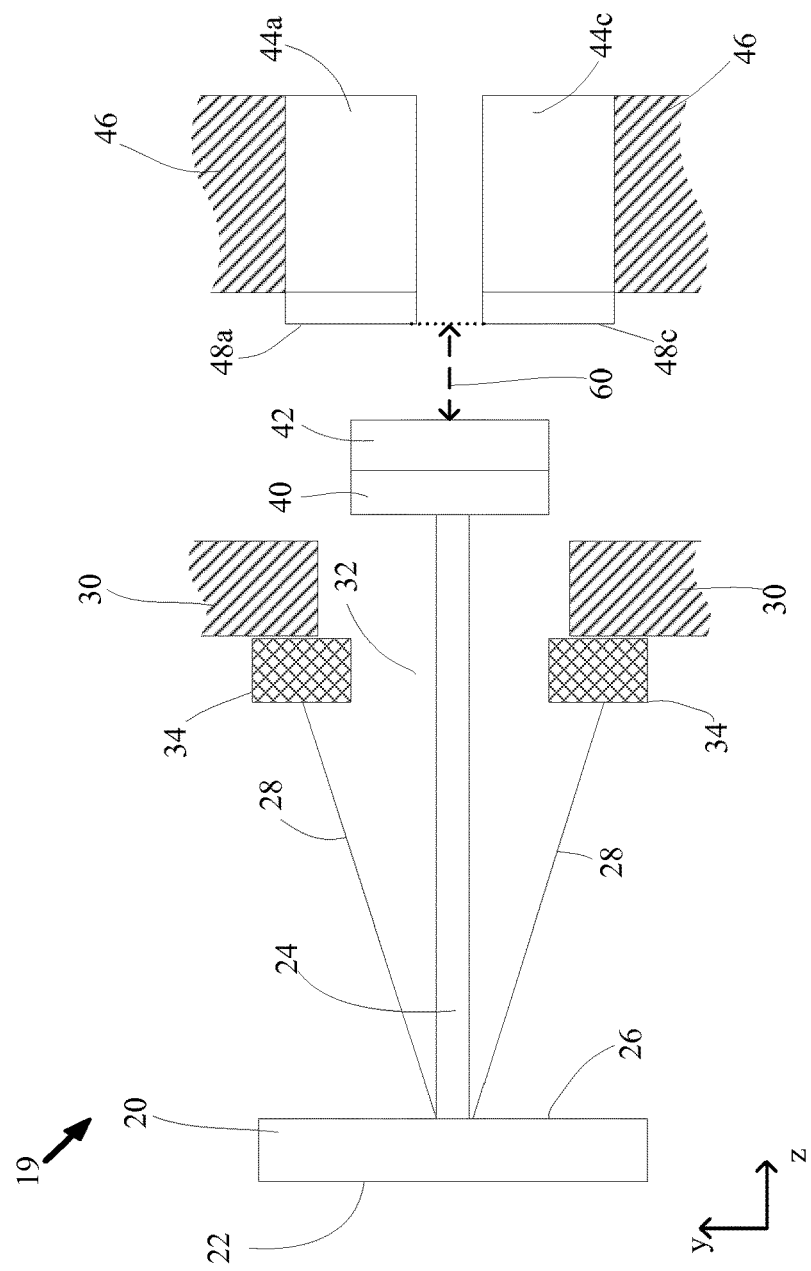

Thus, the leaf springs are connected, via the connector 34, to the support structure 30 and thereby support the mirror 20. The arm 24 is not connected to the support structure 30 but instead passes through an opening 32 in the support structure. Although two leaf springs 28 are depicted in FIG. 2A, in practice, four leaf springs may be provided, with each leaf spring extending in a different direction. For example, two leaf springs 28 may be fixed to the connector 34 at positions which are spaced apart in the y-direction. Another two leaf springs (not depicted) may be connected to the connector 34 at positions which are spaced apart in the x-direction.

Although the depicted embodiment connects the mirror 20 to the support structure 30 using four leaf springs, other forms of connection may be provided. For example, a different number of leaf springs may be provided. A different form of resilient connection may be provided (e.g. some other form of spring). Similarly, the connector may have some other shape and/or configuration. In an embodiment, the connector may be omitted.

The leaf springs 28 resiliently bias the mirror 20 and the arm 24 to an equilibrium orientation. The equilibrium orientation in this embodiment corresponds with the reflective surface 22 of the mirror 20 being substantially parallel to a surface of the support structure and corresponds to the arm 24 passing through the centre of the opening 32 in the support structure. However, in other embodiments the leaf springs 28 may bias the mirror 20 to some other equilibrium orientation. When force is applied to the arm 24, e.g. pushing the arm downwards in FIG. 2A, the leaf springs 28 bend and allow the orientation of the mirror 20 to change. When the force is removed the leaf springs 28 return the mirror 20 to its equilibrium orientation (and return the arm 24 to its equilibrium orientation).

A magnet 40 is located at the end of the arm 24. A layer of inductive material 42 is provided on the magnet 40 (e.g. attached to the magnet using a screw or glued onto the magnet). The magnet 40 allows force to be applied to the arm 24 in order to move the arm and mirror 20 to different orientations. The inductive material 42 allows the orientation of the arm 24 (and mirror 20) to be measured. It may be desirable to provide the magnet 40 with high strength, since the strength of the magnet will determine the force that is applied to the arm 24 for a given current in electromagnets (described below). The magnet 40 may for example be formed from Samarium Cobalt. It may be desirable for the layer of inductive material 42 to be highly inductive, since this determines the strength of signals measured using eddy current sensors (described below). The inductive material 42 may for example be AlMgMn alloy. In general, the magnet 40 and inductive material 42 may comprise any suitable materials. In an embodiment the magnet 40 and inductive material 42 may comprise a single material (e.g. ferrous material which is both magnetic and inductive).

Four electromagnets 44a-d are supported by a second support structure 46. The second support structure 46 may be connected to the support structure 30 which supports the mirror 20 such that a single overall support structure is provided. The electromagnets 44a-d are depicted viewed in cross-section from above in FIG. 2B. As may be seen, two of the electromagnets 44a,c are separated in the y-direction, and two of the electromagnets 44b,d are separated in x-direction. Cartesian co-ordinates are used in this description for ease of understanding, and use the usual lithographic convention in which the direction of the radiation beam is the z-direction. However, it will be appreciated that it is not intended to limit the invention to a particular orientation of the mirror assembly relative to the radiation beam. The electromagnets 44a-d and the magnet 40 on the arm 24 are an example of a mirror actuator. Other forms of mirror actuator may be used, for example some other form of electromagnetic actuator, or a permanent magnet moved by a mechanical actuator.

An eddy current sensor 48a-d is provided at the end of each electromagnet 44a-d. The eddy current sensors 48a-d are depicted in FIG. 2C and have the same configuration as the electromagnets 44a-d. The eddy current sensors 48a-d are an example of a sensing apparatus. Other forms of sensing apparatus may be used. For example, the sensing apparatus may comprise an optical sensor arranged to measure the position and/or phase of a beam of radiation reflected off the surface of the magnet 40.

Figure 3:
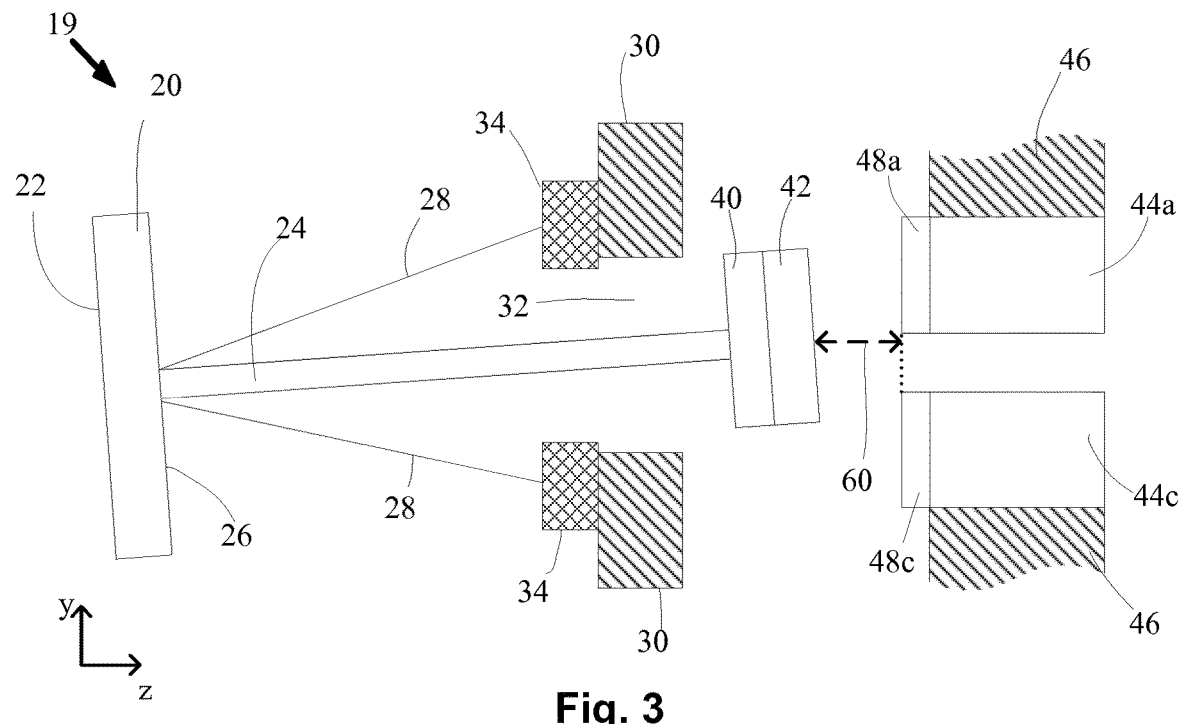
FIG. 3 depicts the mirror assembly with the mirror oriented away from an equilibrium orientation.

A controller CT (see FIG. 1) delivers current to electromagnets 44a-d, the current being selected to generate a magnetic field which applies a desired force to the magnet 40 and thereby moves the magnet to a desired position. This causes the arm 24 to rotate and moves the mirror 20 to a desired orientation. An example of mirror rotation to a desired orientation using the electromagnets is depicted in FIG. 3. In this example, current is being passed through the first electromagnet 44a in a direction which generates a magnetic field that attracts the magnet 40. Simultaneously, current is being passed through the third electromagnet 44c in the opposite direction, thereby generating a magnetic field which repels the magnet 40. In addition, current is being passed through the second electromagnet 44b in a direction which generates a magnetic field that attracts the magnet 40. Finally, current is being passed through the four electromagnet 44d in a direction which generates a magnetic field that repels the magnet 40. The forces acting on the magnet 40 move the magnet in the positive y-direction as depicted and also in the positive x-direction (although this is not visible in FIG. 3). This movement causes the leaf springs 28 to bend and causes rotation of the mirror 20. The eddy current sensors 48a-d sense eddy currents induced by the magnetic field in the inductive material 42. The eddy current sensors 48a-d are thereby able to determine the position of the inductive material and are thus able to determine the position of the arm 24. This in turn allows the orientation of the mirror 20 to be calculated.

The mirror assembly 19 depicted in FIG. 2 is part of an array of mirrors. The array of mirrors may be a faceted field mirror device 10 (as depicted in FIG. 1). In use, as mentioned further above, it may be desired to form a particular illumination mode at the faceted pupil mirror device 11. This can be achieved by selecting orientations of mirrors 20 of the faceted field mirror device 10 such that the radiation beam is directed towards particular desired locations at the faceted pupil mirror device 11. For example, the mirrors 20 may be oriented to direct radiation to two zones on the faceted pupil mirror device 11 to form a dipole mode, or may be oriented to direct radiation to four zones on the faceted pupil mirror device in order to form a quadrupole mode. The controller CT (see FIG. 1) may be used to control the orientations of the mirrors 20 of the array. The controller CT may achieve this by controlling currents which are delivered to the electromagnets 44a-d associated with the mirrors 20. The controller CT may receive measurements from the eddy current sensors 48a-d associated with the mirrors, and may use these measurements as feedback when controlling the current delivered to the electromagnets 44a-d.

Figure 4:
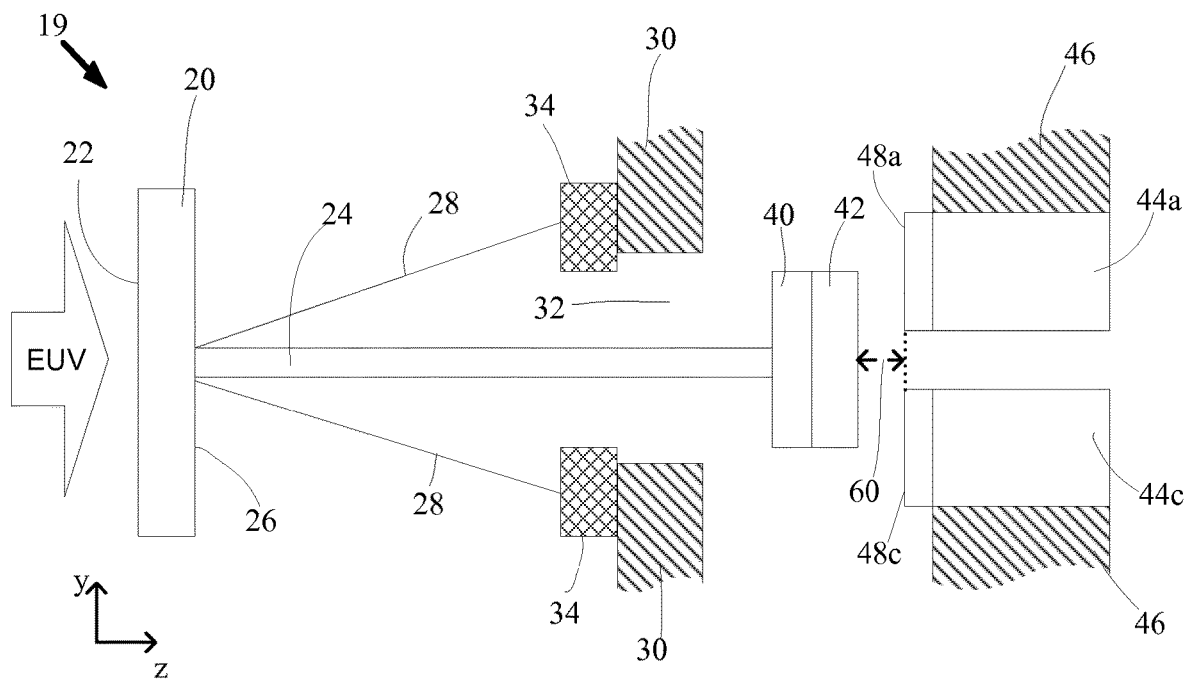
FIG. 4 depicts the mirror assembly in an equilibrium orientation but with EUV radiation incident upon the mirror.

FIG. 4 schematically depicts the same apparatus as is depicted in FIGS. 2 and 3. However, in FIGS. 2 and 3 no radiation is incident upon the mirror 20, whereas in FIG. 4 radiation is incident upon the mirror. In this embodiment the radiation which is incident upon the mirror 20 comprises EUV radiation (schematically depicted by an arrow). Although the mirror 20 reflects EUV radiation it is not a perfect reflector, but instead reflects around 60% of incident EUV radiation. Thus, a substantial amount of EUV radiation is absorbed by the mirror 20 and causes heating of the mirror. The arm 24 is metal (e.g. steel, copper or an alloy) and is thermally connected to the mirror. The arm 24 may for example be welded or braised to the mirror 20. The thermal connection between the arm 24 and the mirror 20 may be such that when the mirror is heated to a given temperature the arm is heated to substantially the same temperature.

The arm has a length of several centimeters (e.g. between 5 and 10 centimeters, e.g. around 7 centimeters). Because the arm 24 is formed from metal it has a significant coefficient of thermal expansion. Therefore, as the arm 24 becomes hotter it expands. The expansion of the arm 24 moves the magnet 40 and inductive material 42 towards the eddy current sensors 48a-d and the electromagnets 44a-d. The arm 24 is free to expand and contract because it is not fixed to the support structure 30.

The expansion of the arm 24 is determined by the temperature of the arm. The temperature of the arm 24 is in turn determined by the temperature of the mirror 20, and the temperature of the mirror 20 is determined by the amount of EUV radiation absorbed by the mirror. The amount of EUV radiation absorbed by the mirror 20 depends upon the power of the EUV radiation incident upon the mirror. Therefore, measuring the expansion of the arm 24 provides an output which depends directly upon the power of EUV radiation incident upon the mirror 20. The expansion of the arm 24 may be measured by measuring a change of a separation between the inductive material 42 and the eddy current sensors 48. This may be referred to as measuring a change of a gap 60 between the inductive material 42 and the eddy current sensors 48. The gap 60 is indicated at a point between the eddy current sensors 48a,c and a dotted line is therefore included to guide the eye.

The gap 60 between the inductive material 42 and the eddy current sensors 48a-d may be measured using the eddy current sensors. Output signals from the eddy current sensors 48a-d can be used by a processor PR to measure the gap 60, thereby allowing the power of EUV radiation incident upon the mirror 20 to be measured. Although the processor PR is depicted as a separate entity from the controller CT, the processor may form part of the controller. The processor PR may perform calculations described further above.

The gap 60 between the inductive material 42 and the eddy current sensors 48a-d may be determined by adding together signals output from two of the eddy current sensors instead of subtracting them (subtraction of eddy current signals is used to measure x and y direction movement of the inductive material). For example, signals output by eddy current sensors 48a,c separated in the y-direction may be added together to generate a measurement of the gap 60 between the inductive material 42 and the eddy current sensors. Signals output by the eddy current sensors 48b,d separated in the x-direction may be added together to obtain a second gap measurement. Either of these measurements of the gap 60 is sufficient to allow the power of EUV radiation incident upon the mirror 20 to be measured. Therefore, some redundancy is present. This redundancy may advantageously allow the gap measurement to be performed, for example even if one of the eddy current sensors ceases to operate. Alternatively, the measurements obtained using the x and y-direction eddy current sensors 48a-d may be used to generate an average measurement. This may advantageously improve the accuracy of the gap measurement which is obtained because of the impact of, for example, a single eddy current sensor which is not measuring correctly is reduced.

The eddy current sensors 48a-d create alternating electromagnetic fields. These induce eddy currents in the inductive material 42 which oppose the alternating electromagnetic fields created by the sensors 48a-d. The sensors probe the formation of secondary electromagnetic fields and thereby determine information regarding the proximity of the inductive material 42.

In an embodiment, the gap 60 may be measured when no EUV radiation is incident upon the mirror 20 (FIG. 2) and then subsequently measured when EUV radiation is incident upon the mirror (FIG. 4). The change of the gap 60 may then be determined. The change of the gap 60 is directly determined by the power of EUV radiation incident upon the mirror 20.

In an embodiment of the invention around 200 W of EUV radiation may be incident upon the faceted field mirror device 10, and around 80 W may be absorbed by the faceted field mirror device. As a result, significant expansion of the arm 24 occurs, providing a change of the gap 60 of a few microns. This allows the incident EUV radiation power to be measured with reasonable accuracy.

The gap measurement in its simplest form may be performed when the arm 24 and the mirror 20 are in their equilibrium position (as depicted in FIGS. 2 and 4). In this position the inductive material 42 is located substantially symmetrically between the x-direction eddy current sensors 48b,d and the y-direction eddy current sensors 48a,c. As a result, the signals output from the eddy current sensors 48a-d are indicative solely of the gap 60 between the inductive material 42 and the eddy current sensors 48a-d, and are not influenced by x-direction or y-direction displacement of the inductive material. This allows the gap to be determined in a straightforward manner.

However, when all of the mirrors 20 and associated arms 24 of the array are in their equilibrium positions, the resulting distribution of radiation at the faceted pupil mirror device 11 will not correspond with an illumination mode which may be used by the lithographic apparatus to project patterns onto substrates with high accuracy and quality. Thus, if gap measurements are to be performed with all of the mirrors 20 in equilibrium positions, then this may be done when the lithographic apparatus is not being used to expose production substrates. The gap measurements may be performed, for example, during initial set-up of the lithographic apparatus. The gap measurements may be performed, for example, after pre-determined periods of time have elapsed. In one example the gap measurements may be performed each day, each week or after multiple weeks. In one example the gap measurements may be performed after a lot of substrates has been exposed and before the next lot of substrates has been exposed. A lot may consist of between 20 and 30 substrates, e.g. 25 substrates.

Gap measurements may be performed for a plurality of mirrors 20 of the mirror array. This in turn allows EUV radiation power measurements to be determined for a plurality of positions across the mirror array. This is advantageous compared with a single EUV radiation power measurement because it distinguishes between a generalised change of the power of EUV radiation and spatially localized changes of the power of EUV radiation.

In an embodiment, two sets of gap measurements taken at different times with incident EUV radiation may be compared. For each set the gap may be compared with the gap seen with no EUV radiation incident upon the mirrors, such that two gap change measurements are obtained. If the power of EUV radiation on substantially all of the mirrors has reduced in the second measurement, as indicated by a smaller gap change, then a general reduction of the output power of the EUV radiation source has occurred. If the EUV radiation power at most of the mirrors has remained substantially the same (the gap change is substantially the same) but there has been a change of EUV radiation power at a sub-set of mirrors (the gap change at those mirrors has changed significantly) then this indicates a spatially localized problem. The spatially localized problem may for example be localised contamination on the collector). Similarly, if a reduction of EUV power is seen for substantially all of the mirrors (i.e. the same gap change for those mirrors) but some of the mirrors see a significantly larger drop of EUV radiation power (i.e. a smaller gap change) then this may indicate that the power of the EUV radiation source has dropped generally but in addition there is a spatially localized problem such as contamination on the collector.

Figure 5:
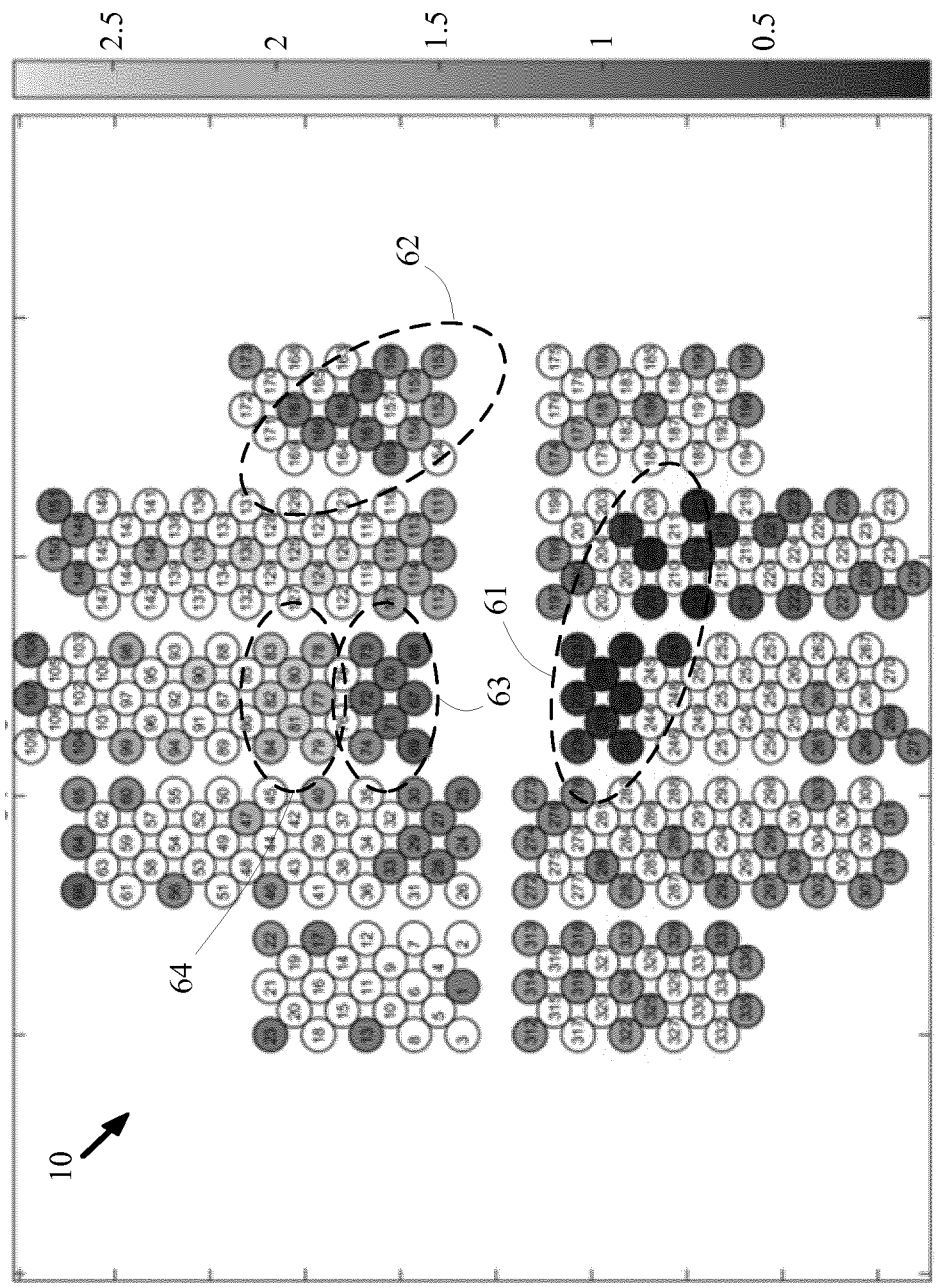
FIG. 5 depicts results of a measurement obtained using an embodiment of the invention.
Figure 6:
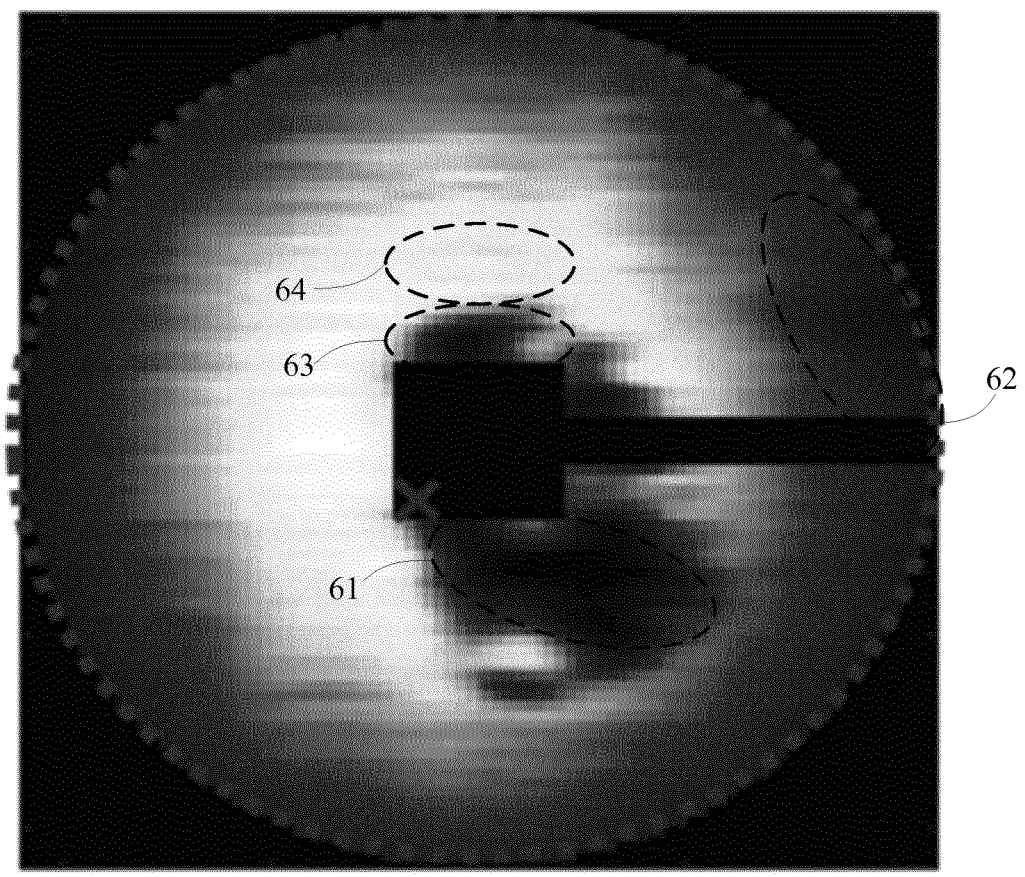
FIG. 6 depicts EUV radiation as reflected from a collector of the lithographic apparatus when the measurement of FIG. 5 was performed.

FIG. 5 depicts the results of gap change measurements preformed at the faceted field mirror device 10 using an embodiment of the invention (indicated scale in microns). FIG. 6 is a photograph of a collector 5 of the lithographic apparatus in which the measurement of FIG. 5 was obtained, the photograph indicating the power of EUV radiation reflected from the collector. The time available to perform the gap measurements was limited (the gap measurements were performed whilst other experimental measurements were being performed). Consequently, the gap was not measured for each mirror of the faceted field mirror device 10, and instead gap measurement were performed for a distributed subset of mirrors. However, in other embodiments the gap may be measured for all mirrors of the faceted field mirror device 10. In FIG. 5 each mirror is numbered for ease of identification.

The gaps were measured when no radiation was incident upon the mirrors. The gaps were then measured again when EUV radiation was incident upon the mirrors. Referring to FIG. 4, for each mirror 20 there was an expansion of the arm 24 which reduced the size of the gap 60 between the inductive material 42 and the eddy current sensors 48a-d. The change of the gap size ranged from less than 0.1 microns more than 2.5 microns. The changes of the gaps 60 are depicted in FIG. 5. In FIG. 5 darker shading indicates smaller changes of the gap and lighter shading indicates larger changes of the gap. There are no mirrors at the centre of the faceted field mirror device 10. This is because, as may be seen from FIG. 6, no radiation is received from the collector 5 at that position.

Referring to FIG. 1, the EUV radiation received at the faceted field mirror device 10 is an image of the collector 5 as illuminated by the EUV radiation emitted from the plasma 4. It follows that the gap 60 measurements shown in FIG. 5 should correspond with the power of EUV radiation reflected from the collector as depicted in FIG. 6. From comparison of FIGS. 5 and 6 it can be seen that this correspondence is indeed present. Thus, in a region 61 immediately below the centre of the collector 5 contamination has built up on the collector such that it no longer reflects the EUV radiation and a dark region is present in FIG. 6. The gap measurements in FIG. 5 indicate this dark region, with little or no change of the gap 60 having taken place (e.g. an expansion of less than 0.1 microns). In another example, contamination has built up at an area 62 close to the right hand edge of the collector 5. This contamination has reduced the power of EUV radiation but some EUV radiation remains. This is seen in FIG. 5 as changes of between 1 and 1.5 microns of the gap in that area (significantly smaller than gap changes seen in other locations which receive higher power EUV radiation). In another example, at an area 63 immediately above the centre of the collector 5 some contamination is present but an area immediately 64 above that receives high power EUV radiation. This again may be seen in FIG. 5, where the gap change seen for mirrors close to the opening is small (around 1 micron) whereas the gap change for the area 66 above that area is significantly greater (more than 2 microns).

As noted further above, the measurement performed to generate the results depicted in FIG. 5 was limited in nature and did not measure the gap 60 for all of the mirrors of the faceted field mirror device 10. Nevertheless, this limited measurement identifies the locations of contamination on the collector 5 and also provides an indication of the degree of contamination (e.g. how strongly the contamination attenuates EUV radiation). In other words, the power of EUV radiation reflected by the collector 5 has been measured in a manner which allows the location and the degree of contamination on the collector 5 to be determined.

The results obtained using the gap change measurements may be combined together to provide a measurement of the collective EUV radiation power as incident at the faceted field mirror device 10.

As noted further above, measurements of the gap 60 may be performed when the mirror 20 and arm 24 are in their equilibrium position, or may be measured when the mirror and arm are rotated away from their equilibrium position. The length of the arm 24 is a few centimeters (e.g. around 7 centimetres) whereas the angular rotation of the arm is a few milliradians. Consequently, rotation of the arm away from its equilibrium position will not have a significant effect upon the gap between the inductive material 42 and the eddy current sensors 48a-d. A measurement of the outputs from the eddy current sensors 48a-d may still be used to determine the gap 60. The measurement is performed in the same way as described above, i.e. by adding together outputs from one or more pairs 48a,c, 48b,d of eddy current sensors. However, when a mirror 20 is rotated away from its equilibrium position the angle of incidence of the EUV radiation upon that mirror is changed and this in turn affects the proportion of EUV radiation which is reflected by the mirror and the proportion which is absorbed. This is because, as mentioned above, the mirror comprises a series of layers with thicknesses selected to provide constructive interference of EUV radiation reflected from layer boundaries, and tilting the mirror will have the effect of presenting layers of increased thickness to the EUV radiation. Since the reflectivity and absorbance of the mirror 20 is modified when it is tilted, the accuracy of the EUV radiation power measurement obtained using the tilted mirror will be reduced accordingly. The accuracy of the measurement may be improved by performing a calibration of the effect of the tilt and then taking that calibration into account when performing subsequent measurements. However, the need for calibration and the potential for reduced measurement accuracy is avoided if measurements are performed when the mirror is in its equilibrium position. An advantage which arises from performing measurements when the mirrors are not in their equilibrium positions is that this allows EUV radiation power measurements to be performed during production exposure of substrates. This is advantageous because it avoids lost productivity which would occur if substrate production was stopped in order to perform the measurement.

The results depicted in FIG. 5 were obtained by gathering eddy current output signals from each mirror in sequence, and this caused the measurements to be relatively slow. However, in other embodiments signals output from eddy current sensors may be received in parallel. For example, faceted field mirror device 10 comprises ten groups of mirrors, and the eddy current signals output from each group of mirrors may be received and processed simultaneously. In another embodiment a multiplexer may be used to cycle through eddy current signals output from all of the mirrors in turn, gathering data from each mirror and storing it in a memory for subsequent processing. An arrangement of this type may be capable of gathering the data rapidly, for example in less than 10 seconds, for example around 5 seconds.

Timescales over which measurements according to embodiments of the invention are performed are significantly shorter than a time constant over which the temperature of the mirror 20 and arm 24 drops when EUV radiation is no longer incident upon it. Thus, accurate measurements may be obtained using embodiments of the invention when EUV radiation is not incident upon the mirror array. In any event, as explained above, measurements may be obtained using embodiments of the invention when EUV radiation is incident upon the mirror array (e.g. during a production exposure).

As has been explained above in connection with FIGS. 5 and 6, embodiments of the invention allow localised build-ups of contamination on the collector 5 to be identified. Embodiments of the invention also allow a general reduction of the power of EUV radiation over time to be detected. Both of these are relative measurements, i.e. measurements of the gap 60 which are compared with previously obtained gap 60 measurements. However, embodiments of the invention may also be used to obtain absolute measurements of EUV radiation power, by using a known relationship between the power of incident radiation and gap changes. In an embodiment the known relationship comprises stored data indicating gap changes for a plurality of different incident radiation intensities. In an embodiment the known relationship is expressed as a model which takes into account the absorption of radiation by the mirror 20, a thermal expansion coefficient of the arm 24, and the length of the arm. The model may also take into account the spectrum of radiation emitted by the plasma 4, the thermal resistivity of the leaf springs 28, the length of the leaf springs and their thermal expansion coefficient. By taking into account the known relationship, for a given gap 60 measurement the power of EUV radiation incident upon a mirror 20 may be measured.

Determining the power of EUV radiation incident upon the faceted field mirror device 10 allows adjustment of the power of EUV radiation output by the radiation source SO using feedback control. This allows the power of EUV radiation to be kept relatively high such that more substrates can be exposed per hour whilst ensuring that the power of EUV radiation is not so high that it will damage the lithographic apparatus.

The majority of EUV radiation is absorbed by components of the lithographic apparatus before it reaches the substrate W. This affects operation of the lithographic apparatus, and corrections may be applied accordingly. For example, EUV radiation may be absorbed by components of the projection system PS, an effect known as lens heating. This may introduce distortion into projected patterns. Components of the projection system may be adjusted to reduce such distortion. Embodiments of the invention allow the power of EUV radiation to be measured upstream of most components of the lithographic apparatus, and thus allow the amount of absorbed EUV radiation to be estimated more accurately. This in turn allows adjustments of the lithographic apparatus to be performed more accurately (e.g. lens heating corrections).

Although in the embodiment depicted in FIG. 5 the faceted field mirror device 10 (an example of a mirror array) has 336 mirrors, in other embodiments a mirror array with some other number of mirrors may be used. If a significantly smaller number of mirrors is used then the spatial resolution with which the EUV radiation power is measured will be correspondingly reduced. Similarly, if the number of mirrors is increased then the spatial resolution with which the EUV radiation power is measured will be correspondingly increased.

Referring to FIG. 1, a sensor S provided on the substrate table WT may be used to measure the power of EUV radiation as reflected by particular mirrors 20 of the faceted field mirror device 10. The sensor S may detect EUV radiation directly, or may include a layer of material which converts EUV to a longer wavelength which is more easily detectable. Because the sensor S is located downstream of the illumination system IL, patterning device MA and projection system PS, these three elements will have an impact upon the power of EUV radiation seen at the sensor S. However, the impact of each of these elements may be known and/or separately measured and their effects removed from the measurement. Consequently, for given mirror 20 two measurements can be obtained. The first measurement, obtained using an embodiment of the invention, is a measurement of the power of EUV radiation incident upon the mirror 20. The second measurement, obtained using the sensor S, is a measurement of the power of EUV radiation reflected by that mirror 20 onto the sensor. These two measurements allow a problem with the mirror, such as from example degradation of the reflectivity of the mirror, to be identified. In one normalised example, a normalised radiation power of 100 at the mirror 20 may be expected to provide a radiation power of 1 at the sensor S. If a significantly lower radiation power is seen (e.g. 0.5), then this may be interpreted as meaning that the reflectivity of the mirror has been degraded (less radiation is being reflected by the mirror and more radiation is being absorbed). Remedial action can then be taken to mitigate the impact of that mirrors lowered reflectivity. For example, an illumination mode formed using the faceted field mirror device 10 may be modified to reduce any impact of degraded mirrors. During maintenance of the lithographic apparatus, if the number of degraded mirrors is sufficiently high that it will affect operation of the lithographic apparatus then the faceted field mirror device 10 may be replaced.

It was previously possible using the sensor S to measure the power of EUV radiation as reflected by each mirror of the faceted field mirror device 10. However, because the measurements were downstream of the illumination system IL, patterning device MA and projection system PS they were subject to influence by those elements and therefore could be subject to some resulting inaccuracy. Embodiments of the invention advantageously provide a measurement of the EUV radiation power incident at the mirrors 20 of the faceted field mirror device 10 which is measured directly at those mirrors. This measurement is therefore not influenced by the illumination system IL, patterning device MA and projection system PS and thus can provide a more accurate measurement. Although it may be possible to provide a sensor or camera within the radiation source SO itself to monitor EUV radiation power, this is a relatively harsh environment which is subject to contamination. Embodiments of the invention provide measurement of the EUV radiation power at a position which is outside of this harsh environment but is at the first optical component outside of the harsh environment (the faceted field mirror device). Embodiments of the invention therefore avoid potential contamination issues whilst at the same time avoiding a potential lack of accuracy arising from elements located between the radiation source and the location at which measurements are performed.

The lithographic apparatus may include EUV radiation sensors at other locations. For example, a sensor may be provided at the output of the illumination system IL. Measurements obtained using embodiments of the invention may be compared with outputs from this sensor (or other sensors) to allow additional information regarding the lithographic apparatus to be determined. For example, by comparing the EUV radiation power at the faceted field mirror device 10 (as measured using an embodiment of the invention) with the power of a EUV radiation at the output of the illumination system IL, the transmission of the illumination system can be determined.

Damage of a mirror 20 may be identified by comparing the change of gap 60 seen for that mirror with the change of gap seen for adjacent mirrors. For example, if the change of gap 60 of a mirror is significantly higher than the change of gap 60 of immediately adjacent mirrors then this may indicate that the reflectivity of that mirror has reduced significantly (that mirror it is now absorbing more EUV radiation than adjacent mirrors which are receiving approximately the same amount of EUV radiation). The mirror may therefore be identified as damaged.

The power of EUV radiation incident at the substrate W is a limiting factor upon the throughput of the lithographic apparatus (i.e. the number of substrates which may be patterned per hour using lithographic apparatus). In general it therefore desirable for the EUV radiation power to be as high as possible. However, some components of the lithographic apparatus, such as a pellicle which protects the patenting device MA, may be subjected to damage if EUV radiation with too high power is incident upon them. Therefore, it may be desirable to operate the EUV radiation source at a power which is just below the level at which damage of components such as the pellicle will occur. Embodiments of the invention provide a measurement of EUV radiation which may be used by a controller as feedback to adjust the operation of the radiation source SO and thereby keep the EUV radiation power at a desired level. This may help to provide good throughput of the lithographic apparatus without damaging components such as the pellicle.

In an embodiment, the invention may form part of a mask inspection apparatus. The mask inspection apparatus may use EUV radiation to illuminate a mask and use an imaging sensor to monitor radiation reflected from the mask. Images received by the imaging sensor are used to determine whether or not defects are present in the mask. The mask inspection apparatus may include optics (e.g. mirrors) configured to receive EUV radiation from an EUV radiation source and form it into a radiation beam to be directed at a mask. The mask inspection apparatus may further include optics (e.g. mirrors) configured to collect EUV radiation reflected from the mask and form an image of the mask at the imaging sensor. The mask inspection apparatus may include a processor configured to analyse the image of the mask at the imaging sensor, and to determine from that analysis whether any defects are present on the mask. The processor may further be configured to determine whether a detected mask defect will cause an unacceptable defect in images projected onto a substrate when the mask is used by a lithographic apparatus.

In an embodiment, the invention may form part of a metrology apparatus. The metrology apparatus may be used to measure alignment of a projected pattern formed in resist on a substrate relative to a pattern already present on the substrate. This measurement of relative alignment may be referred to as overlay. The metrology apparatus may for example be located immediately adjacent to a lithographic apparatus and may be used to measure the overlay before the substrate (and the resist) has been processed.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although FIG. 1 depict the radiation source SO as a laser produced plasma LPP source, any suitable source may be used to generate EUV radiation. For example, EUV emitting plasma may be produced by using an electrical discharge to convert fuel (e.g. tin) to a plasma state. A radiation source of this type may be referred to as a discharge produced plasma (DPP) source. The electrical discharge may be generated by a power supply which may form part of the radiation source or may be a separate entity that is connected via an electrical connection to the radiation source SO.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A mirror array, at least some of the mirrors of the array comprising a reflective surface and a mirror arm which extends from a surface opposite to the reflective surface, the mirror array comprising:
   a support structure provided with a plurality of sensing apparatuses, the sensing apparatuses being configured to measure gaps between the sensing apparatuses and the mirror arms which extend from the mirrors; and
   a processor configured to determine a power of radiation incident upon the mirrors based on the measured gaps.

2. The mirror array of claim 1, wherein the sensing apparatuses are configured to measure gaps between the sensing apparatuses and ends of the mirror arms.

3. The mirror array of claim 2, wherein a magnet and inductive material are provided at the end of at least some of the mirror arms.

4. A mirror array comprising:
   a plurality of mirrors, at least some of the mirrors of the array comprising a reflective surface and a mirror arm which extends from a surface opposite to the reflective surface; and
   a support structure provided with a plurality of sensing apparatuses, the sensing apparatuses being configured to measure gaps between the sensing apparatuses and the mirror arms which extend from the mirrors;
   wherein the sensing apparatuses are configured to measure gaps between the sensing apparatuses and ends of the mirror arms;
   wherein a magnet and inductive material are provided at the end of at least some of the mirror arms; and
   wherein at least some of the sensing apparatuses comprise a plurality of eddy current sensors.

5. A system comprising the mirror array of claim 1 and further comprising a processor configured to receive the measured gaps between the sensing apparatuses and the associated mirror arms when EUV radiation is incident upon the mirror array, the processor further being configured to compare the measured gaps with gaps previously measured when EUV radiation is not incident upon the mirror array to provide gap change measurements.

6. The system of claim 5, wherein the processor is configured to compare gap change measurements with previously obtained gap change measurements.

7. The system of claim 5, wherein the processor is configured to determine a power of radiation incident upon the mirrors using a known relationship between the power of incident radiation and the gap changes.

8. The system of claim 7, wherein the known relationship is expressed as a model which takes into account the absorption of radiation by mirrors of the mirror array, a thermal expansion coefficient of the mirror arm, and the length of the mirror arm.

9. The system of claim 7, wherein the known relationship comprises stored data indicating gap changes for a plurality of different incident radiation intensities.

10. A lithographic apparatus comprising:
an illumination system configured to condition a radiation beam;
a support structure constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto the substrate, wherein the illumination system comprises a mirror array according to claim 1.

11. A lithographic apparatus comprising:
an illumination system configured to condition a radiation beam;
a support structure constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto the substrate, wherein the illumination system comprises a system according to claim 5, wherein the lithographic apparatus further comprises a sensor provided on the substrate table, and wherein the processor is configured to compare measurements obtained using the sensing apparatuses of the mirror array with measurements obtained using the sensor on the substrate table.

12. The lithographic apparatus of claim 11, wherein the lithographic apparatus further comprises a sensor provided on the patterning device support structure, and wherein the processor is configured to compare measurements obtained using the sensing apparatuses of the mirror array with measurements obtained using the sensor on the patterning device support structure.

13. A method of measuring radiation power at a mirror array, the mirror array comprising at least some mirrors which comprise a reflective surface and a mirror arm which extends from a surface opposite to the reflective surface, the mirror array further comprising a support structure provided with a plurality of sensing apparatuses;
wherein the method comprises:
using the sensing apparatuses to measure gaps between the sensing apparatuses and the mirror arms which extend from the mirrors, and
determining a power of radiation incident upon the mirrors based on the measured gaps.

14. The method of claim 13, wherein the gaps are measured when EUV radiation is not incident upon the mirror array and are measured when EUV radiation is incident upon the mirror array, and the measured gaps are compared to provide gap change measurements.

15. The method of claim 14, wherein determining the power of radiation incident upon the mirrors comprises using a known relationship between the power of incident radiation and the gap changes.

16. The mirror array of claim 1, wherein the mirror arms are disconnected from the support structure.

17. The mirror array of claim 1, wherein the mirror arms are freely suspended from the surface opposite to the reflective surface.

18. The mirror array of claim 17, wherein the freely suspended mirror arms are facing the sensing apparatuses.

19. The mirror array of claim 1, wherein the sensing apparatuses are further configured to measure a thermal expansion of the mirror arms by measuring a change of separation of the gaps between the sensing apparatus and the mirror arms.

20. A mirror array comprising:
a plurality of mirror assemblies, wherein each mirror assembly in the plurality comprising:
a mirror having a back surface;
a mirror arm fixed to the back surface of the mirror and extending along an axial mirror arm direction away from the back surface of the mirror; and
a sensing apparatus positioned relative to the mirror arm and configured to sense one or more properties about the mirror arm; and
a processor in communication with each sensing apparatus, the processor configured to measure an expansion of the mirror arm associated with the sensing apparatus along the axial mirror arm direction based on the sensed one or more properties about the mirror arm.

21. The mirror array of claim 20, wherein the processor is configured to estimate a radiation power at the mirror array based on the measured mirror arm expansions.

* * * * *